(12) United States Patent
Bucher et al.

(10) Patent No.: US 7,525,375 B2
(45) Date of Patent: Apr. 28, 2009

(54) METHOD OF CORRECTING THE OUTPUT SIGNAL OF AN ANALOG AMPLIFIER, AMPLIFIER MODULE AND MEASURING DEVICE

(75) Inventors: Cyrill Bucher, Uster (CH); Daniel Reber, Madetswil (CH); Philip R. Ouellette, Westerville, OH (US)

(73) Assignee: Mettler-Toledo AG, Greifensee (CH)

( * ) Notice: Subject to any disclaimer, the term of this patent is extended or adjusted under 35 U.S.C. 154(b) by 131 days.

(21) Appl. No.: 11/639,265

(22) Filed: Dec. 15, 2006

(65) Prior Publication Data

US 2007/0152509 A1 Jul. 5, 2007

Related U.S. Application Data

(60) Provisional application No. 60/751,636, filed on Dec. 20, 2005.

(51) Int. Cl.
*H03F 1/02* (2006.01)
(52) U.S. Cl. ............................................. 330/9; 330/69
(58) Field of Classification Search ..................... 330/9, 330/51, 69
See application file for complete search history.

(56) References Cited

U.S. PATENT DOCUMENTS

| | | |
|---|---|---|
| 3,550,013 A | 12/1970 | Gurol |
| 3,995,174 A | 11/1976 | Zrudsky |
| 4,048,574 A | 9/1977 | Barbier et al. |
| 4,868,411 A | 9/1989 | Ishihara |
| 5,012,436 A * | 4/1991 | Burri .............................. 330/9 |
| 5,621,350 A * | 4/1997 | Schulz ........................... 330/9 |
| 6,611,168 B1 | 8/2003 | Denison et al. |

FOREIGN PATENT DOCUMENTS

| | | |
|---|---|---|
| EP | 0 760 936 B1 | 3/1997 |
| GB | 1168873 | 10/1969 |

OTHER PUBLICATIONS

Tietze, U., Schenk, "*Kapitel* (Chapter) 7: *Digitaltechnik Grundlagen*", Halbleiterschaltungs-technik (Semiconductor Circuit Design), 2002, pp. 621-647, 12th Edition, 1st reprint, Springer Verlag, Berlin, DE.
International Search Report dated Feb. 17, 2006 (with English translation of category of cited documents).

* cited by examiner

*Primary Examiner*—Khanh V Nguyen
(74) *Attorney, Agent, or Firm*—Buchanan Ingersoll & Rooney PC

(57) ABSTRACT

A method is disclosed for correcting transfer errors of an analog amplifier that occur following a jump in the amplifier input signal caused by switching. A measuring device includes at least one sensor as well as a signal-processing unit connected to the sensor and analog amplifier. The signal-processing unit includes at least one modulator and/or a multiplexer, an analog amplifier and at least one processing stage following the analog amplifier in the circuit chain. The processing stage, dependent on the point in time when the switching jump occurs, is separated from the latter during a predetermined timeout phase duration by means of a switch that is arranged between the analog amplifier and the processing stage and is controlled by a timeout controller, and/or dependent on the point in time when the switching jump occurs, said processing stage is blocked by a timeout controller during a predetermined timeout phase duration.

28 Claims, 10 Drawing Sheets

METHOD OF CORRECTING THE OUTPUT SIGNAL OF AN ANALOG AMPLIFIER, AMPLIFIER MODULE AND MEASURING DEVICE

CROSS REFERENCE TO RELATED APPLICATIONS

This application claims priority under 35 U.S.C. §119 to U.S. Provisional Application 60/751,636 filed in the U.S. Patent and Trademark Office on Dec. 20, 2005, the entire contents of which are hereby incorporated by reference in their entireties.

FIELD

A method, an amplifier module and a measuring device are disclosed, wherein a signal is amplified in a signal-processing unit, converted and transmitted to an output device.

BACKGROUND INFORMATION

Analog amplifiers, in particular operational amplifiers and differential amplifiers are used in signal-processing units in which an output signal of, e.g. a temperature-, humidity-, force-, or pressure sensor is transformed and processed. In most cases, sensors and signal-processing units are combined into so-called measuring devices and are used in industrial environments. An important group of measuring devices which impose very stringent requirements on a signal-processing unit are the force-measuring devices, in particular the gravimetric measuring devices.

The gravimetric measuring devices such as thermo-analysis instruments, balances, humidity-measuring instruments and the like incorporate force-measuring cells which are based on different designs depending on the requirements imposed on their accuracy or measurement resolution. A representative example for a relatively economical design is the force-measuring cell with a deformable body and strain gauges.

As a rule, strain-gauge-based force measuring cells and measuring devices function according to the principle of resistance measurements. They make use of the phenomenon that the resistance of a strain gauge is proportionate to the strain, i.e., the relative change in length, and the length change, in turn, is proportionate to the force acting on the force-measuring cell. To perform an accurate measurement, the strain gauges are often connected in a bridge circuit.

The bridge circuit, as well as the half-bridge circuit, belongs to the known state of the art as a circuit arrangement in which at least one of the resistors used in the bridge circuit is variable in regard to its resistance value. This condition is met by many of the known sensors. For example, the electrical resistance of strain gauges changes dependent on the strain that they are subjected to.

For cost reasons and for the sake of simplicity, one chooses in general a DC power supply for the measuring device and thus also a DC amplification although, due to the commonly known technical limitations, this choice often has disadvantages, specifically DC voltage errors such as thermo-voltage errors or voltage-offset errors in the analog amplifier as well as excessive low-frequency noise in the entire circuit. Thermo-voltages can occur at the connecting joints of the required cables leading from the resistor bridge to analog amplifiers, if different materials and temperatures are involved at the connecting joints. These errors need to be held below an acceptable tolerance limit or, in other words, the measuring signal needs to stand out clearly from the error voltages.

The aforementioned measurement errors, such as thermo-electrical effects, noise and temperature effects in analog amplifiers that follow in the circuit chain are often reduced by the application of additional AC-modulation and -amplification techniques. This technique of modulation and amplification is also disclosed in EP 0 760 936 B2. A carrier-frequency generator produces an AC voltage signal (square-wave AC voltage signal) which is supplied to a bridge circuit. The output signal of the bridge is passed on by way of a symmetric differential amplifier to a demodulator. The demodulator in the form of a changeover switch is controlled by the carrier-frequency generator.

Analog amplifier circuits with switched amplifiers are used in many applications. In this arrangement, the two signals arriving from the measuring bridge circuit are each delivered to one operational amplifier during one measurement phase by means of two analog changeover switches. During a second measurement phase, however, the signal-connections are crossed over so that each signal is fed, respectively, to the other amplifier. This alternating changeover of the sensor signals is reversed again, for example with two further analog changeover switches which operate in phase with the input switches, putting the two amplified sensor signals alternatingly on direct and crossed-over paths.

These concepts offer many advantages. First, the offset voltage drift of the operational amplifiers can be suppressed. In a non-switched differential amplifier, after the two output signals of the differential amplifier have been subtracted from each other, the output signal also contains, in addition to the amplified sensor signal, the offset voltage difference of the two operational amplifiers multiplied by the differential amplification factor. In a switched differential amplifier, the offset voltage of the first operational amplifier is added in one phase to the first sensor signal, while the offset voltage of the second operational amplifier is added to the second sensor signal. As the sensor signals during the second measurement phase are crossed over before they are fed to the operational amplifiers, the same sensor signals now receive the respective offset voltage of the other operational amplifier. Accordingly, the offset voltage difference of the switched amplifier changes its polarity in each measurement phase. If the measurement phases follow each other for example at a sufficiently high frequency, the polarity changes will be fast enough to allow their removal from the signal by means of a low-pass filter.

As a second advantage, the 1/f-noise can be suppressed. Every operational amplifier exhibits below a certain frequency threshold a significant increase in noise which follows approximately a 1/f-relationship. In many applications, for example in force-measuring devices with strain gauge force-measuring cells, only static or very slow-changing signals are of interest, for example in the range from 0 to 1 Hz. With a non-switched differential amplifier, the 1/f-noise which predominates at these low frequencies is superimposed on the measurement signal, whereby the quality of the amplified sensor signals is severely compromised. With a switched differential amplifier, the changeover switches at the input of the differential amplifier or of the sensor cause the static or low-frequency sensor signals to be folded in the frequency range with the switchover signal of a switch controller and, among other things, to be raised to the frequency of the switchover signals. If the latter is sufficiently greater than the 1/f frequency threshold, only the white noise of the operational amplifier, which is much smaller at this point in the frequency range, is superimposed on the folded sensor signal. White noise is known in the engineering sciences and natural sciences as a physical noise whose amplitude is constant over the power density spectrum. The power of a random signal is obtained by integrating its power density spectrum over the entire resistance (from minus infinity to plus infinity). Thus, the white noise in a theoretical sense has an infinite signal energy. In practical cases, however, the power density of white noise falls off at very high frequencies.

With the second changeover switches at the output of the differential amplifier, the sensor signals are with regard to their frequency characteristics folded back again into the domain of DC or low frequency. In addition, the 1/f-noise of the operational amplifiers is folded upwards to the switchover frequency by the second changeover switches. This noise can subsequently be suppressed by means of a low-pass filter.

The concepts explained above keep their principal validity for a modulation of any desired shape. The sensor signals can for example be sinusoidally modulated at the input to the differential amplifier. At the output of the differential amplifier, the signals can subsequently be restored by means of sinusoidally controlled demodulators.

A sinusoidal signal is chosen in a case where, e.g. an AC voltage source is available or if the preservation of the signal over long connecting distances is of primary concern. In practice, the modulation with square-wave signals has established itself, due to the lower technical requirements for the circuit design which leads to lower costs. This type of modulation is realized often by means of analog switches.

With a square-wave AC modulation, for example by means of analog switches, the amplifier input signals change instantaneously. However, since analog amplifiers have only a limited bandwidth and rise time, their output signals cannot immediately follow the input signals. If the rise time is the limiting element, the amplifier output signal will ramp up approximately as a linear function of time. If the bandwidth is the limiting factor, the amplifier output signal will go through a transient oscillation with an approximately exponential decay. In any event, the assumption that the amplifier output signal equals the amplifier input signal multiplied by the amplification factor is no longer true during the transient oscillation. However, the assumption is based on a constant amplification factor. As long as the bandwidth and the rise time remain constant, the transfer errors caused by them in the amplifier output signal can be considered as constant. These transfer errors can for example be built into a scale factor as a fixed quantity and will thus disappear.

New, highly homogeneous materials for the deformable bodies of force-measuring cells, advanced manufacturing methods as well as precision strain gauges have made it possible to manufacture high-resolution force-measuring cells also based on strain gauge technology. In order to take advantage of the performance of these high-resolution force measuring cells, the signal-processing unit has to be adapted to meet the new requirements.

Extensive serial investigations of different analog amplifiers of the same build led to the conclusion that the bandwidth and rise time of analog amplifiers show in some cases a wide scatter of the results from one unit to the next and in addition that they behave differently under comparable temperature conditions (see FIG. 11). The term "scatter between units" in this context means the deviations in the behavior of elements of the same build relative to each other. The investigations have thus led to the conclusion that the speed of the transient decay, and therefore also the resultant error in amplitude, are variable. Thus, the scale factor, too, is likewise variable and is likewise subject to the scatter between units and the effects of temperature. These transfer errors have to be removed by performing an individual balancing of the scatter between units and compensation of the temperature effects. Procedures of this kind add considerably to the cost and make the manufacturing process as well as the product more expensive.

SUMMARY

A method is disclosed for the correction of transfer errors that are due to the physically limited operating capabilities of at least one analog amplifier that is part of the signal-processing unit of a measuring device. An amplifier module and a measuring device can be created that operate according to the method.

The method can serve to correct transfer errors of an analog amplifier that are due to its physically limited capabilities in following an abrupt discontinuity, i.e. a jump, in the amplifier input signal caused by switching. A signal-processing unit includes at least one modulator and/or a multiplexer, an analog amplifier and at least one processing stage that follows the analog amplifier, wherein a) dependent on the point in time when the switching jump occurs, the processing stage after the analog amplifier is separated from the latter during a predetermined timeout phase, and/or b) dependent on the point in time when the switching jump occurs, the processing stage after the analog amplifier is blocked during a predetermined timeout phase.

The arrangement for controlling the timeout includes means for detecting a switching jump and thus for triggering the timeout phase. If the measuring device is equipped with a modulator and/or a multiplexer that includes a switchover controller, the timeout signals of the timeout controller can be triggered dependent on the switchover signals of the switchover controller.

As the analog amplifiers show in part a wide scatter of the results from one unit to the next and in addition, as they behave differently under comparable temperature conditions, the duration of the timeout phase is preferably predetermined dependent on the rise time of the analog amplifier. If the length of the timeout phase equals the rise time of the analog amplifier multiplied by a factor between 2 and 7, one can be assured that the scatter between units and the temperature effects in the amplifier output signal are largely eliminated no later than at the signal output of the processing stage that follows the analog amplifier. The rise time of an analog amplifier can be calculated from the slew rate (in v/µs), which is normally listed in the data sheet of the amplifier manufacturer.

If the bandwidth is the limiting element of the amplifier, the output signal will approximately conform to an exponential function which has a characteristic time constant. Ideally, the length of the timeout phase equals the time constant of the analog amplifier multiplied by a factor between 4 and 10. The time constants can be found for example by calculation or by measurements.

As a sensible solution, the length of the timeout phase therefore equals either the rise time or the time constant of the amplifier, multiplied by a factor between 2 and 10, with the decision in each case to be governed by which of the two is the larger value.

In an exemplary embodiment, the processing stage after the analog amplifier is separated from the latter by means of a switch that is arranged between the analog amplifier and the processing stage, wherein the switch is actuated by a timeout-controller circuit.

In a further exemplary embodiment, the signal-processing unit includes a demodulation switch after the analog amplifier. A switchover controller of the modulator actuates the demodulation switch for the synchronous demodulation of the modulated signal, and a timeout controller, by giving a timeout signal, holds the demodulation switch at a high-resistance level or in a high-resistance state during the timeout phase.

Of course, the processing stage after the analog amplifier can be an analog/digital converter circuit, wherein a timeout phase is produced by a timeout controller actuating a trigger-signal switch, and wherein the trigger-signal switch during the timeout phase interrupts a trigger signal which is necessary for the A/D conversion.

If the processing stage after the analog amplifier is an analog/digital converter circuit, the timeout phase can be produced by combining the timeout controller with a trigger-signal generator which generates the trigger signals required for the A/D conversion. With this combined control for the trigger-signal generator and the timeout, the timeout signals generated by the timeout controller are superimposed on the trigger signals during the duration of the timeout phase, or the generating of the trigger signals is suppressed or activated with a delay.

The modulator and/or the multiplexer can be equipped with a switchover controller, so that the timeout signals of the timeout controller can be generated dependent on the switchover signals of the switchover controller.

The output signal of at least one sensor can be sent to the amplifier as amplifier input signal. Of course, it is also possible to transmit the output signals of at least two sensors sequentially to the at least one analog amplifier by means of the multiplexer.

In various exemplary embodiments, the amplifier input signal or the input voltage of the sensor is modulated preferably as a square wave voltage signal by means of the modulator.

The aforementioned signal-processing module can also be designed as an amplifier module for use in a multitude of measuring devices. This amplifier module or integrated amplifier module includes at least one modulator and/or a multiplexer with at least one switchover controller, at least one analog amplifier following in the chain after the modulator and/or multiplexer, and at least one processing stage following the analog amplifier, wherein the processing stage includes at least one timeout means which serves to produce a timeout phase in the amplifier output signal with a predetermined timeout-phase duration.

The signal-processing unit can also be arranged in a measuring device which includes at least one sensor in addition to the at least one signal-processing unit. The signal-processing unit includes a modulator and/or a multiplexer with a switchover controller. The modulator and/or the multiplexer is followed by at least one analog amplifier, and the amplifier is followed by at least one processing stage. The signal-processing unit further includes at least one timeout means which serves to generate a timeout phase in the amplifier output signal with a predetermined timeout-phase duration.

In one exemplary embodiment of the measuring device, the modulator is arranged immediately ahead of the analog amplifier and serves for the modulation of the amplifier input signal, in order to circumvent the aforementioned problems regarding the offset voltage drift and the 1/f-noise.

In another exemplary embodiment of the measuring device, the modulator is arranged ahead of the at least one sensor in an arrangement where the modulator serves for the modulation of the supply voltage of the sensor and thus for the modulation of the amplifier input signal.

In a further exemplary embodiment, the timeout device consists of a switch which belongs to the signal-processing device and a timeout controller that is connected to the switch. Ideally, the switchover signals of the switchover controller are of a suitable nature to actuate the timeout controller, so that no additional elements are necessary for the detection of the switching jumps in the input signal.

The timeout controller can produce control signals in different ways. The function of generating the timeout signals can be performed for example by an additional signal generator and an exclusive OR element which combines the signal generator signals with the switchover signals. The signal generator signals and the switchover signals are directed to the signal input terminals of the exclusive OR element. The exclusive OR element performs a so-called exclusive OR function which is described in U. Tietze, Ch. Schenk, "Halbleiterschaltungs-technik" (*Semiconductor Circuit Design*), 12$^{th}$ edition, 1$^{st}$ reprint, Springer Verlag, Berlin 2002, Chapter 7. As soon as the input values are unequal, the output of the exclusive OR element takes on a value of 1. Thus, the timeout phase and phase duration is controlled by the phase offset ob the signal generator signal relative to the switchover signal.

Instead of the foregoing ways of realizing the invention, it is of course possible to monitor the input signal of the amplifier by means of a suitable detector for the occurrence of signal jumps. As soon as the detector detects a switching jump, a corresponding signal is sent to the timeout controller, triggering the timeout phase.

In a further exemplary embodiment, the measuring device includes a demodulation switch arranged so that it follows the analog amplifier in the circuit chain. The demodulation switch, which is connected to the switchover controller of the modulator, includes a high-impedance switching stage that is integrated in the demodulation switch, or the demodulation switch can be held at a high-impedance state. The demodulation switch is connected to a timeout controller, wherein the switchover signals of the switchover controller are of a suitable nature to actuate the timeout control of the high-impedance switching stage, and the timeout signals generated by the timeout controller can be combined with or superimposed on the switchover signals.

If the processing stage which follows the analog amplifier in the measuring device is an analog/digital converter circuit, the timeout means can be a trigger signal switch and a timeout controller connected to the trigger signal switch, where the trigger signal switch interrupts a trigger signal that is required for the A/D conversion. Ideally, in this case too, the switchover signals of the switchover controller are used for actuating or triggering the timeout controller.

A further timeout means in a measuring device in which the processing device after the analog amplifier is an analog/digital converter circuit can consist of a combined trigger signal generator and timeout controller which serves to generate one or more of the trigger signals required for the A/D conversion, wherein the switchover signals of the switchover controller are suitable to actuate the timeout controller, and the timeout controller serves to release or block the trigger signals.

The at least one sensor of the measuring device can be a humidity sensor, a temperature sensor, a pressure sensor, a force-measuring cell with strain gauges, or a force-measuring cell according to the principle of electromagnetic force compensation.

Depending on the configuration of the signal-processing unit, the amplifier output signal, after it has been "cleaned up" by timing out the jumps, can be brought by a variety of measures into the form of an amplifier output signal that is expected from an ideal analog or digital amplifier. In a signal-processing unit of the analog kind, the simplest way to adapt the amplifier output signal is by means of an R/C low-pass member. This is in accordance with the classic sample-and-hold concept. Of course, it is also possible to correct the digitized measuring signals leaving the A/D converter by applying a correction factor by means of a processor which follows the A/D converter in the circuit chain, if the missing signal portions of the timeout phase are not bridged over but are set to a fixed voltage, for example 0.0 volts.

In high-precision measuring devices, it has until now been necessary to use amplifiers that work with very high precision in order to meet the required accuracy. These precise and fast amplifiers are very expensive and consume a large amount of current. Using the disclosed exemplary methods offers a problem-free way to use very cost-effective and less precise amplifiers without compromising the accuracy of the measuring device. This is especially true in the case where a signal-processing unit has several amplifiers following each other in the circuit chain and where the errors of all of the amplifiers are eliminated by means of a single timeout means at the end of the amplifier chain.

Of course, each individual amplifier can also have its own timeout means. Ideally, a design concept of this type is implemented as an integrated amplifier module that is operable to perform the afore-described method.

BRIEF DESCRIPTION OF THE DRAWINGS

The invention is hereinafter explained in more detail with references to drawings, wherein.

DETAILED DESCRIPTION

Figure 1:
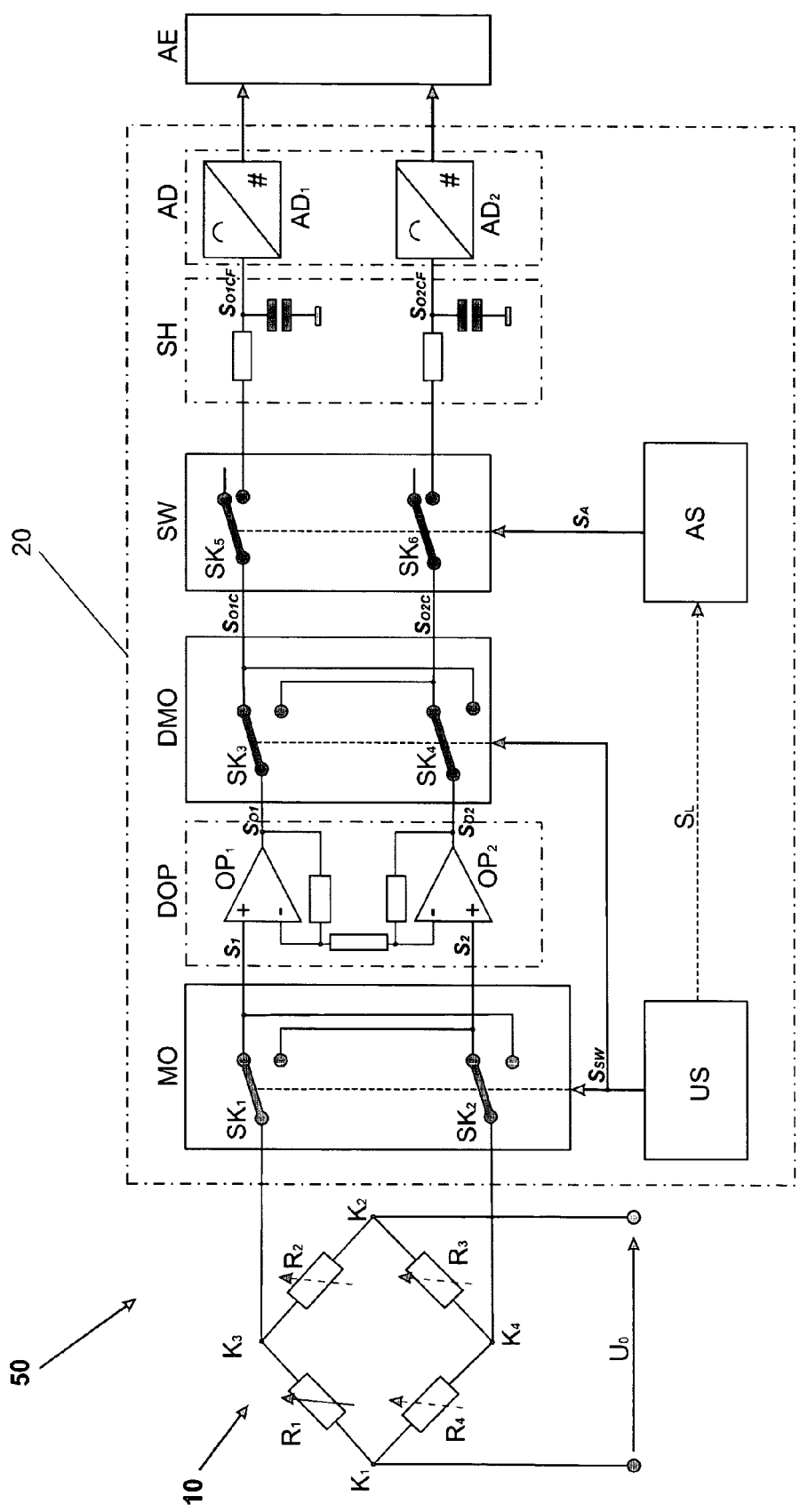
FIG. 1 schematically illustrates an exemplary measuring device with a sensor indicated in the form of a Wheatstone bridge and with a signal-processing unit that is equipped with a timeout means containing a switch and a timeout controller connected to the switch.

FIG. 1 gives a schematic representation of an exemplary measuring device 50 with a sensor 10 indicated in the form of a Wheatstone bridge circuit. The actual sensor element needs to be variable in the amount of its electrical resistance, so that the resistance value exhibits in the ideal case a linear dependence on the parameter to be measured or at least follows the latter according to a known systematic relationship. As is known, at least one of the four schematically represented resistors $R_1$, $R_2$, $R_3$, $R_4$ in a full-bridge circuit or at least one of the two resistors $R_1$, $R_2$ in a half-bridge is variable. The strain gauges of a force-measuring cell represent an example for this kind of a circuit arrangement. An operating voltage $U_O$ is applied to the nodes $K_1$ and $K_2$ of the Wheatstone bridge circuit. The two nodes $K_3$ and $K_4$ are connected to a signal-processing unit 20 which contains different processing stages MO, DOP, DMO, SW, SH, AD, AE which are connected so that they follow each other in the sequential order in which they have just been named. The first processing stage of the signal-processing unit is a modulator MO which has at least two switching contacts $SK_1$, $SK_2$, wherein the switching contact $SK_1$ is connected to the node $K_3$ and the switching contact $SK_2$ is connected to the node $K_4$. Depending on the switch position of the switching contacts $SK_1$, $SK_2$, the nodes $K_3$ and $K_4$ are always electrically separated from each other, but are alternatingly connected to the amplifier-signal input terminal of a first amplifier $OP_1$ or to the amplifier-signal input terminal of a second amplifier $OP_2$ of a differential amplifier DOP. The differential amplifier DOP is followed in the circuit chain by a demodulator DMO whose design is identical to the design of the modulator MO. Accordingly, the demodulator DMO likewise has at least two input terminals, at least two output terminals and at least two switching contacts $SK_3$, $SK_4$, with the switching contact $SK_3$ being connected to the amplifier output terminal of the amplifier $OP_1$ and the switching contact $SK_4$ being connected to the amplifier output terminal of the amplifier $OP_2$. The four switching contacts $SK_1$, $SK_2$, $SK_3$, $SK_4$ are synchronously actuated by means of a switchover controller. The demodulator DMO is followed in the circuit chain by a switch SW which has at least the same number of switching contacts $SK_5$, $SK_6$ as the demodulator DMO. Each of the two switching contacts $SK_5$, $SK_6$ is connected to one output terminal of the demodulator DMO, connecting these output terminals either to the subsequent processing stages SH, AD, AE or switching them to a high impedance. Accordingly, the output terminals of the demodulator DMO are either connected to or separated from the subsequent processing stages SH, AD, AE. The switching contacts $SK_5$, $SK_6$ are actuated by way of a timeout controller AS. Preferably, the timeout controller AS is connected to the switchover controller US by way of a signal connection $S_L$, so that the switchover signal $S_{SW}$ of the switchover controller US serves at the same time to trigger the timeout signal $A_S$. The triggering sets the switching contacts $SK_5$, $SK_6$ at high impedance. The timeout phase duration can be defined and stored in memory as a fixed quantity. However, the timeout controller AS can also include means such as a processor and a memory which allow the duration of the timeout phase to be calculated during initialization whereupon the duration remains at a fixed setting during the operating phase. At the end of the timeout phase, the switching contacts $SK_5$, $SK_6$ are reset, so that the output terminals of the demodulator DMO are again connected to the subsequent processing stages SH, AD, AE. Of course, the timeout phase duration can also be defined in hardware by means of timing members. The timeout cycle thus follows the switchover cycle of the modulator MO and the demodulator DMO. The subsequent processing stages SH, AD, AE only serve for the further processing of the signals, with a sample-and-hold processing stage SH consisting of one R/C low-pass member for each signal path serves to bridge over the timeout phase. The analog signals are normally converted into digital signals by means of an analog/digital converter circuit AD and directed to a processor for further processing operations or to an indicator unit AE. In the present example, one of two A/D converters $AD_1$, $AD_2$ is assigned to each signal path. All signals indicated in FIG. 1 will be explained in detail in the context of FIG. 4.

Figure 2:
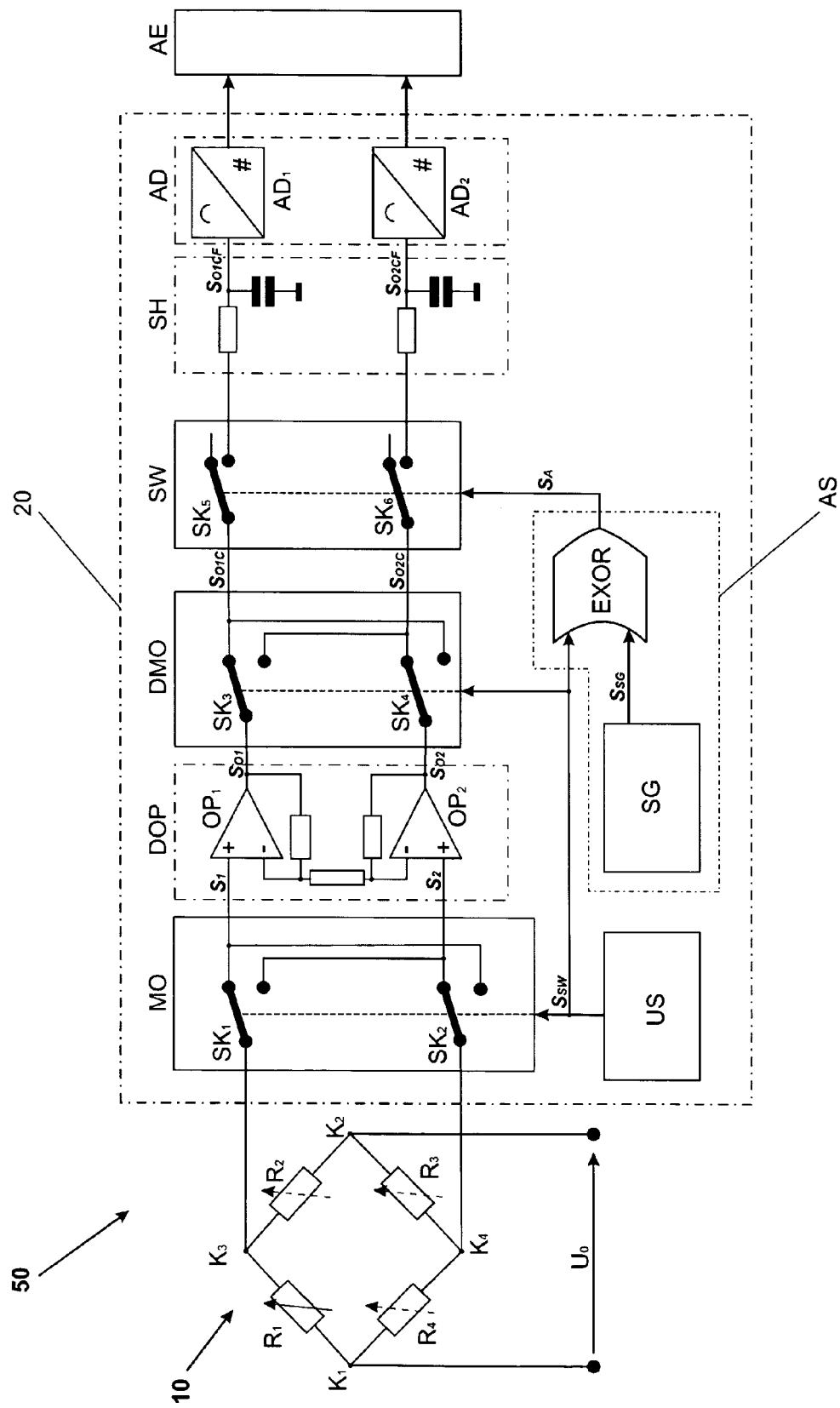
FIG. 2 shows the exemplary measuring device of FIG. 1 with a timeout controller that includes a signal generator and an exclusive OR element.

An exemplary measuring device 50 with a sensor 10 and a signal-processing unit 20 is illustrated schematically in FIG. 2. All elements correspond to those in FIG. 1, with the timeout controller AS being shown with more specific details. The timeout controller AS consists of a signal generator SG and an exclusive OR element EXOR. The signal generator signals $S_{SG}$ and the switchover signals $S_{SW}$ are directed to the signal input terminals of the exclusive OR element EXOR. As soon as the input values $S_{SG}$, $S_{SW}$ cease to be equal, a timeout signal $S_A$ actuates the switching contacts $SK_5$, $SK_6$. This is how the timeout phases $t_1$ to $t_2$, $t_3$ to $t_4$, $t_5$ to t . . . are generated with the phase duration being set by way of the phase offset of the signal generator signal $S_{SG}$ relative to the switchover signal $S_{SW}$. All of the signals indicated in FIG. 2 will be explained in detail below in the context of FIG. 4.

Figure 3:
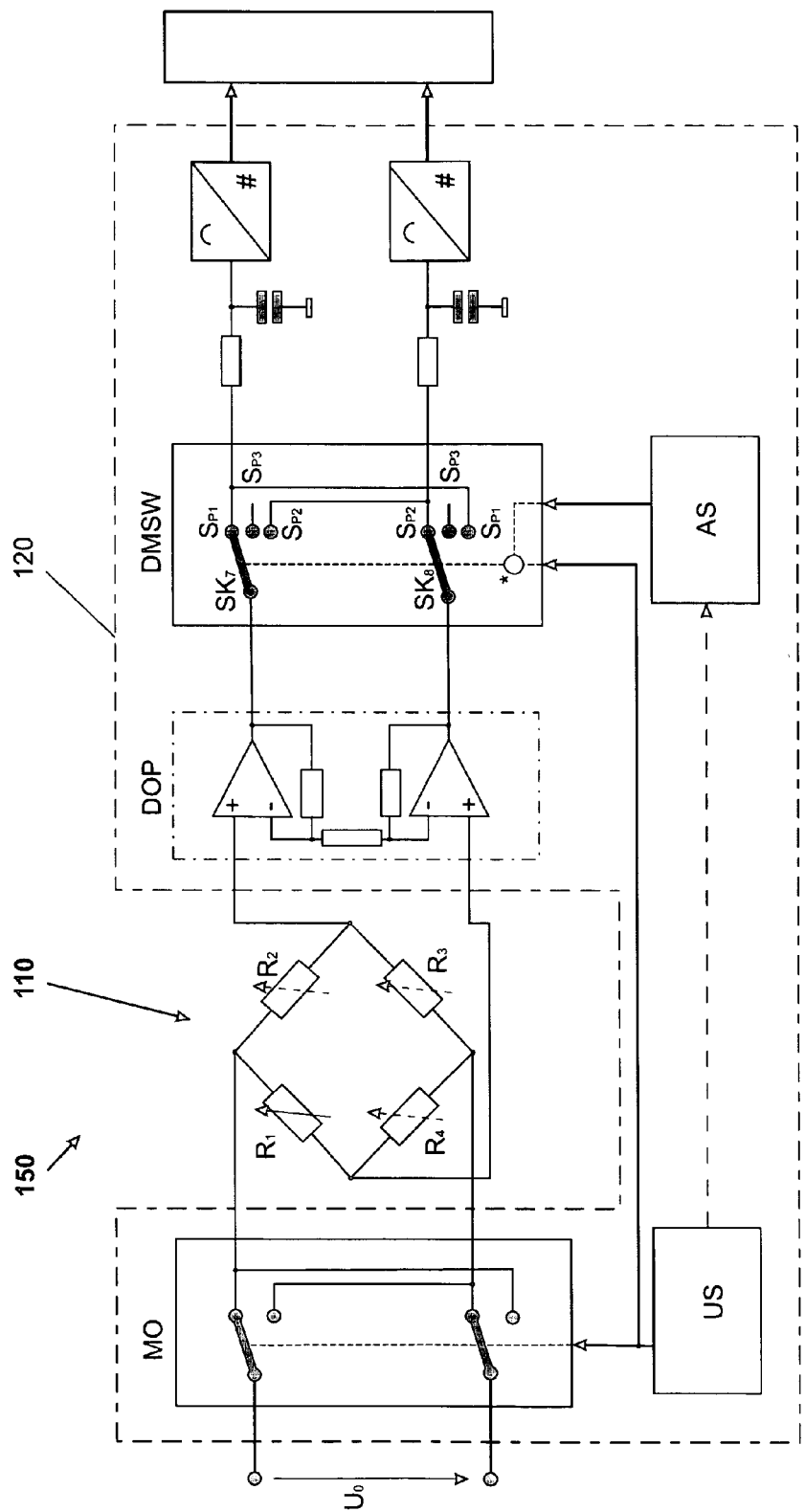
FIG. 3 schematically illustrates another exemplary measuring device with a sensor indicated in the form of a Wheatstone bridge and with a signal-processing unit that is equipped with timeout means containing a high-impedance switching stage integrated in a demodulator, and a timeout controller connected to the demodulator.

FIG. 3 schematically illustrates an exemplary measuring device 150 with a sensor 110 and with a signal-processing unit 120. Except for the absence of the demodulator DMO and the switch SW of FIG. 1, all other elements correspond to those of FIG. 1. In regard to the arrangement of the individual processing stages in the circuit, the only difference from FIG. 1 is that the sensor 150 has now been arranged between the modulator MO and the differential amplifier DOP, in order to benefit from the aforementioned advantages of a measuring bridge circuit that is operated with an AC voltage. The only significant difference of the circuit illustrated in FIG. 3 in comparison to the circuit of FIG. 1 is that the processing stages of the demodulator DMO and switch SW which were described in the context of FIG. 1 have now been combined with each other. Integrated in the demodulation switch DMSW is a high-impedance switching stage $S_{P3}$, which is arranged between the two switch positions $S_{P1}$ and $S_{P2}$ of each of the switching contacts $SK_7$, $SK_8$ at the signal outputs of the demodulation switch DMSW. Instead of using the switching stage $S_{P3}$, one can achieve the same purpose if the switching contacts $SK_7$, $SK_8$ are held in a high-impedance state between the switching positions $S_{P1}$ and $S_{P2}$. The switchover controller US as well as the timeout controller AS act on the switching contacts $SK_7$, $SK_8$, so that a timeout phase is produced for example by superimposing the control signals of the controller elements AS and US on each other.

Figure 4:
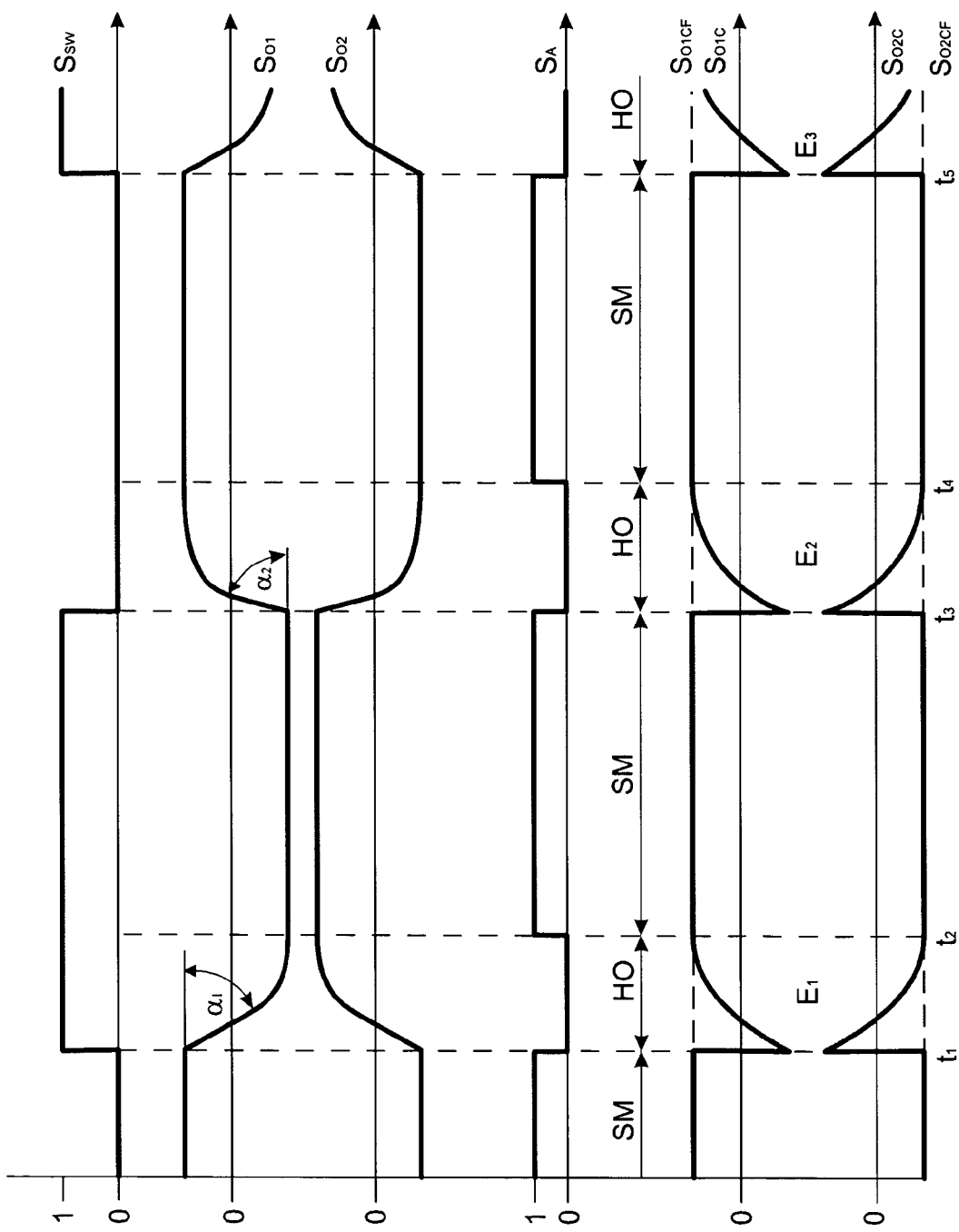
FIG. 4 illustrates exemplary signal profiles pertaining to FIGS. 1, 2 and 3.
Figure 11:
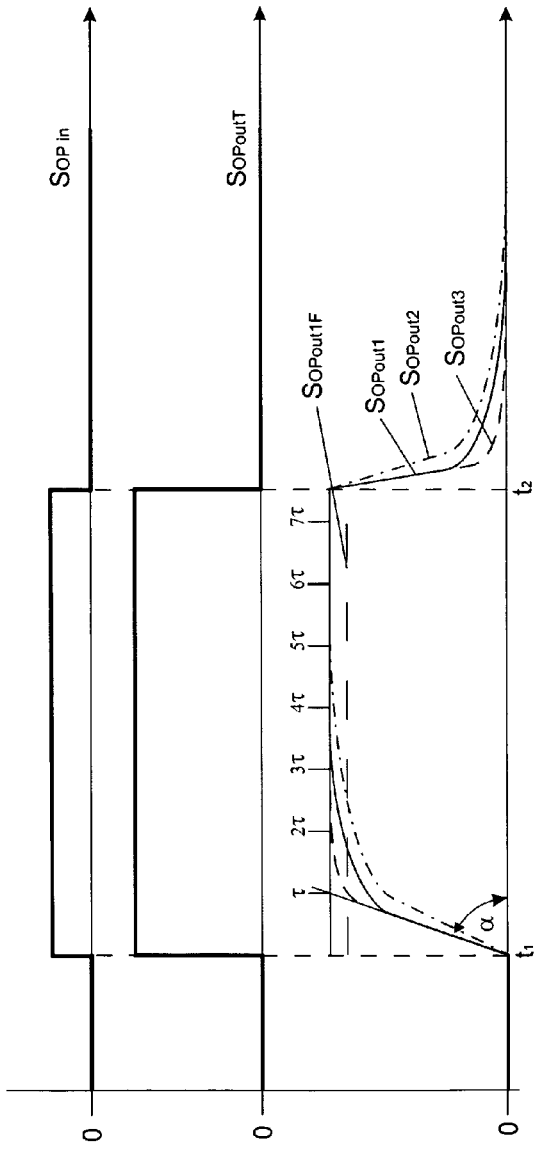
FIG. 11 represents different signal profiles of an amplifier circuit according to the state of the prior art, to illustrate the scatter in the properties between different units and to show the influence of temperature.

FIG. 4 illustrates exemplary signal profiles pertaining to FIGS. 1, 2 and 3. The first graph shows a possible time profile of the switchover control signals $S_{SW}$. The second graph describes a first output signal $S_{O1}$ at the output of the first amplifier $OP_1$. As also shown in FIG. 11 and explained in detail below in the associated part of the description, it can be clearly seen that the rise time and the bandwidth are limited and that this has an effect on the output signal. It can likewise be clearly seen that the slew rate $\alpha_1$, $\alpha_2$ can change from one period to the next. The third graph illustrates a second output signal $S_{O2}$ of the second amplifier $OP_2$. In this case, too, the influence of the limited rise time and bandwidth is clearly evident. The fourth graph shows a possible timeout signal $S_A$, shown here with low active switching level. The fifth graph represents the first demodulated output signal $S_{O1C}$ in the form in which the first output signal $S_{O1C}$ presents itself after the demodulator DMO, if the switching contacts $SK_5$, $SK_6$ are actuated likewise by the switchover signal $S_{SW}$ shown in the first graph. The temporary slumps $E_1$, $E_2$, $E_3$ in the first demodulated output signal $S_{O1C}$ during the timeout phases $t_1$ to $t_2$, $t_3$ to $t_4$, and $t_5$ to t . . . are clearly evident. The broken line indicates the output signal $S_{O1CF}$ as it presents itself at the input of the first A/D converter $AD_1$ after it has been demodulated and filtered by means of the RC low-pass filter of the sample-and-hold processing stage SH. The individual sample phases SM and hold phases HO are likewise shown in the graph and demonstrate clearly how the phases of sampling and holding alternate in accordance with the timeout signal $S_A$. The sixth graph analogously illustrates the corresponding second demodulated output signal $S_{O2C}$ after the demodulator and the associated second demodulated and filtered output signal $S_{O2CF}$ at the input of the second A/D converter $AD_2$.

The exemplary measuring device 250 with its sensor 210 and its signal-processing unit 220 as illustrated schematically in FIG. 5 is again of an analogous design as the embodiment shown in FIG. 1 in regard to the processing stages and their arrangement in the circuit from the sensor 210 to the signal output terminals of the demodulator DMO. Here, too, a differential amplifier DOP is used with two amplifiers $OP_1$ and $OP_2$. Instead of the two processing stages of the switch SW and the sample-and-hold circuit SH, each of the signal output terminals of the demodulator DMO is connected directly to the signal input terminal of the respective A/D converter AD1, AD2. The sample-and-hold processing stage SH can be omitted if certain kinds of A/D converters are used. To produce the timeout phase, the timeout controller AS actuates a trigger signal switch TSW which interrupts the trigger signal connection 221 between a trigger signal generator TR and the A/D converters $AD_1$, $AD_2$ for the duration of the timeout phases. As is known, A/D converters perform their function only if the A/D converter receives trigger signals. Thus, by interrupting the trigger signal connection 221, the A/D conversion is blocked. The subsequent processing stage is of the same type as in FIG. 1, i.e., a processor for further processing operations or an indicator unit AE. All of the signals indicated in FIG. 5 will be explained in detail in the description of FIG. 6 which follows.

Figure 5:
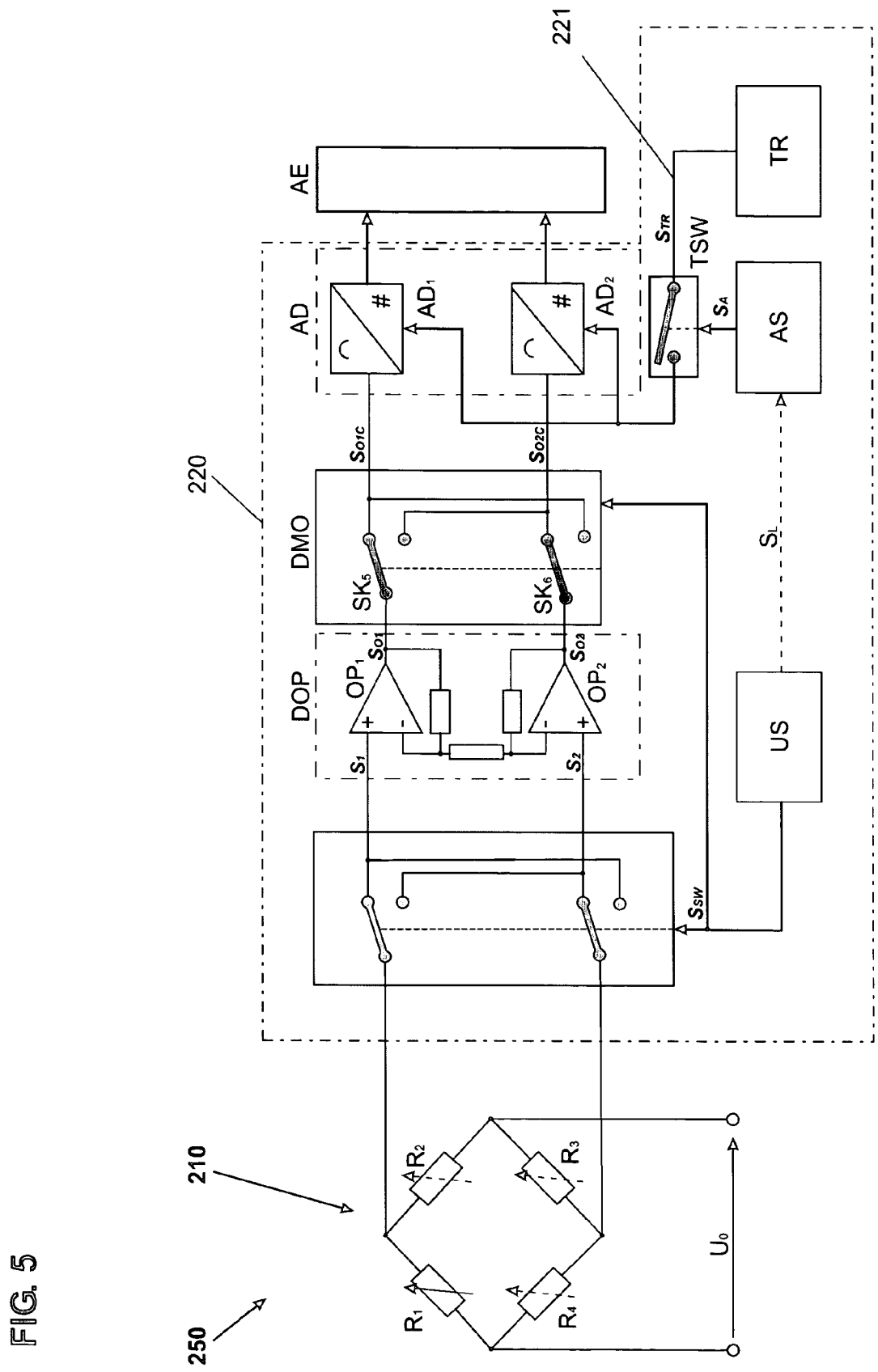
FIG. 5 schematically illustrates another exemplary measuring device with a sensor indicated in the form of a Wheatstone bridge or with a force-measuring cell, and with a signal-processing unit that is equipped with a timeout means containing a trigger signal switch and a timeout controller connected to the trigger signal switch, wherein the trigger signal switch interrupts the trigger signals of a trigger signal generator which are required for the A/D conversion.
Figure 6:
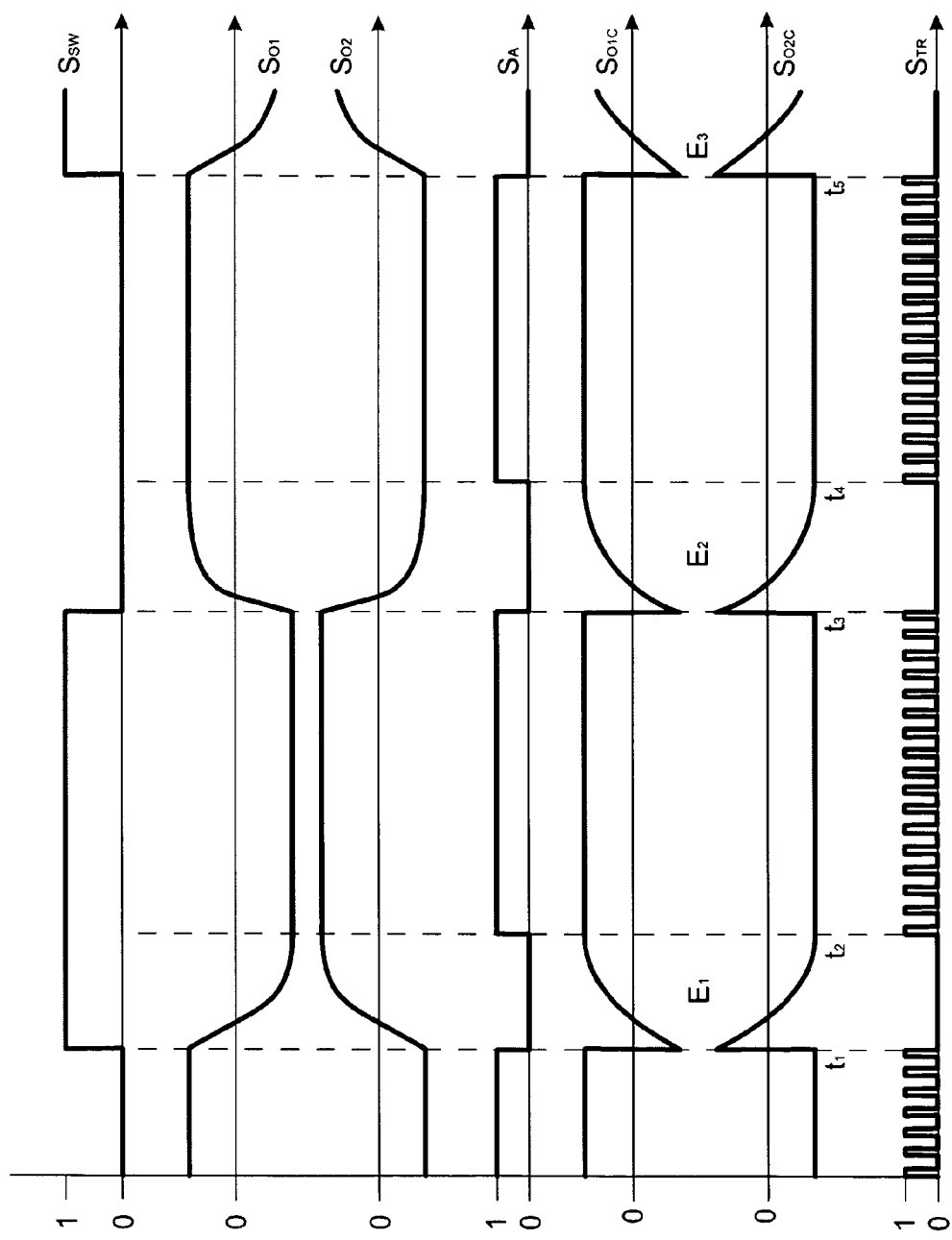
FIG. 6 illustrates exemplary signal profiles pertaining to FIG. 5.

FIG. 6 illustrates exemplary signal profiles pertaining to FIG. 5. The first graph shows a possible time profile of the switchover control signals $S_{SW}$. The second graph describes a first output signal $S_{O1}$ at the output of the first amplifier $OP_1$. In an analogous representation, the third graph illustrates a second output signal $S_{O2}$ of the second amplifier $OP_2$. The fourth graph shows a possible timeout signal $S_A$, shown here with low active switching level. The fifth graph represents the first demodulated output signal $S_{O1C}$ in the form in which the first output signal $S_{O1C}$ presents itself after the demodulator DMO, if the switching contacts $SK_5$, $SK_6$ are actuated likewise by the switchover signal $S_{SW}$ shown in the first graph. The temporary slumps $E_1$, $E_2$, $E_3$ in the first demodulated output signal $S_{O1C}$ during the timeout phases $t_1$ to $t_2$, $t_3$ to $t_4$, and $t_5$ to $t \ldots$ are clearly evident. The seventh graph illustrates possible trigger signals $S_{TR}$ for the A/D converters $AD_1$, $AD_2$. As is clearly evident, the timeout signal $S_A$ which actuates the trigger signal switch TSW suppresses the triggering of the A/D converters during the timeout phases $t_1$ to $t_2$, $t_3$ to $t_4$, $t_5$ to $t \ldots$.

Figure 7:
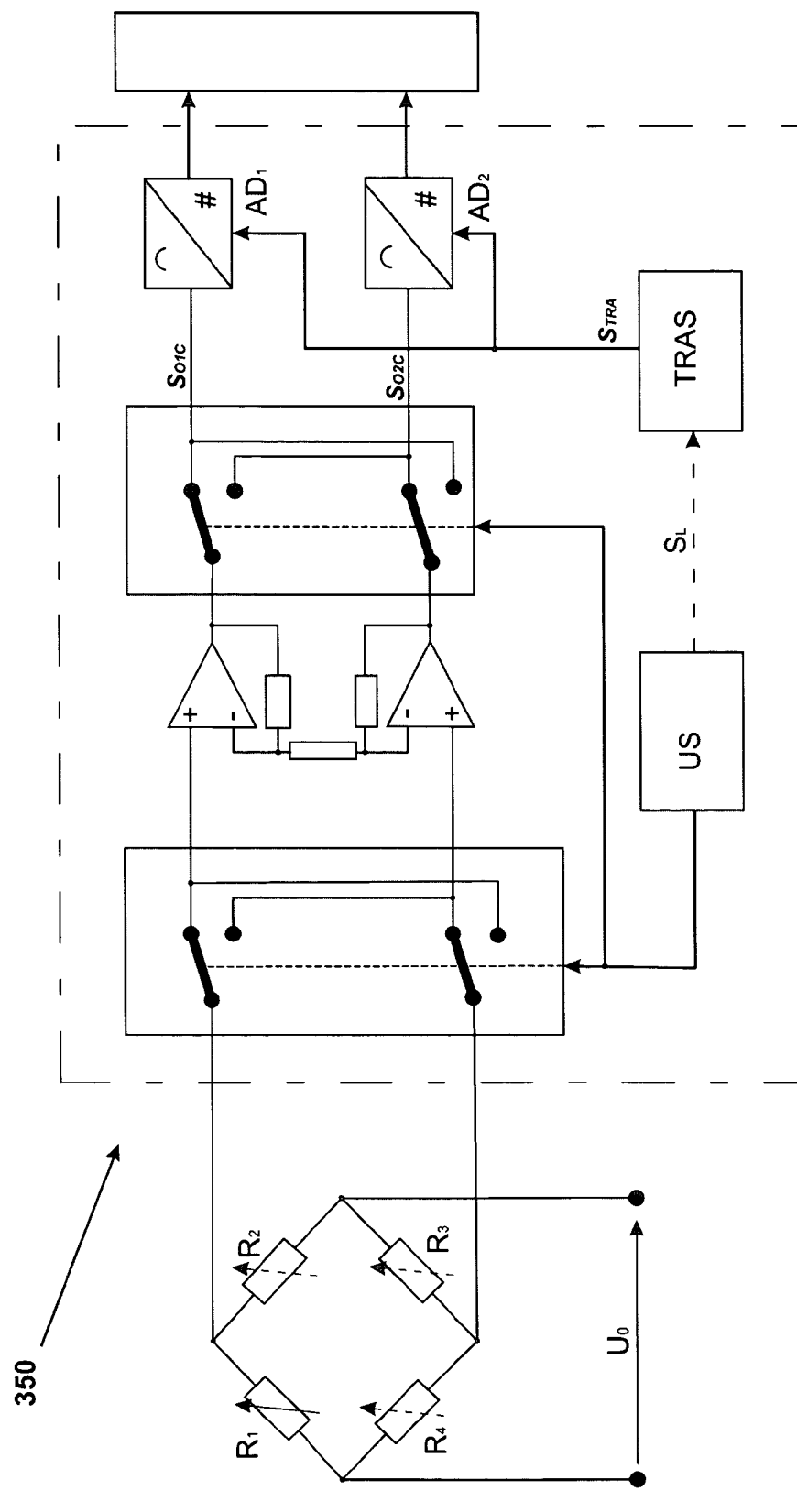
FIG. 7 schematically illustrates another exemplary measuring device with a sensor indicated in the form of a Wheatstone bridge or with a force-measuring cell, and with a signal-processing unit that is equipped with timeout means containing a combination of a trigger signal switch and a timeout controller, wherein the timeout controller causes releasing and blocking of the trigger signals.
Figure 8:
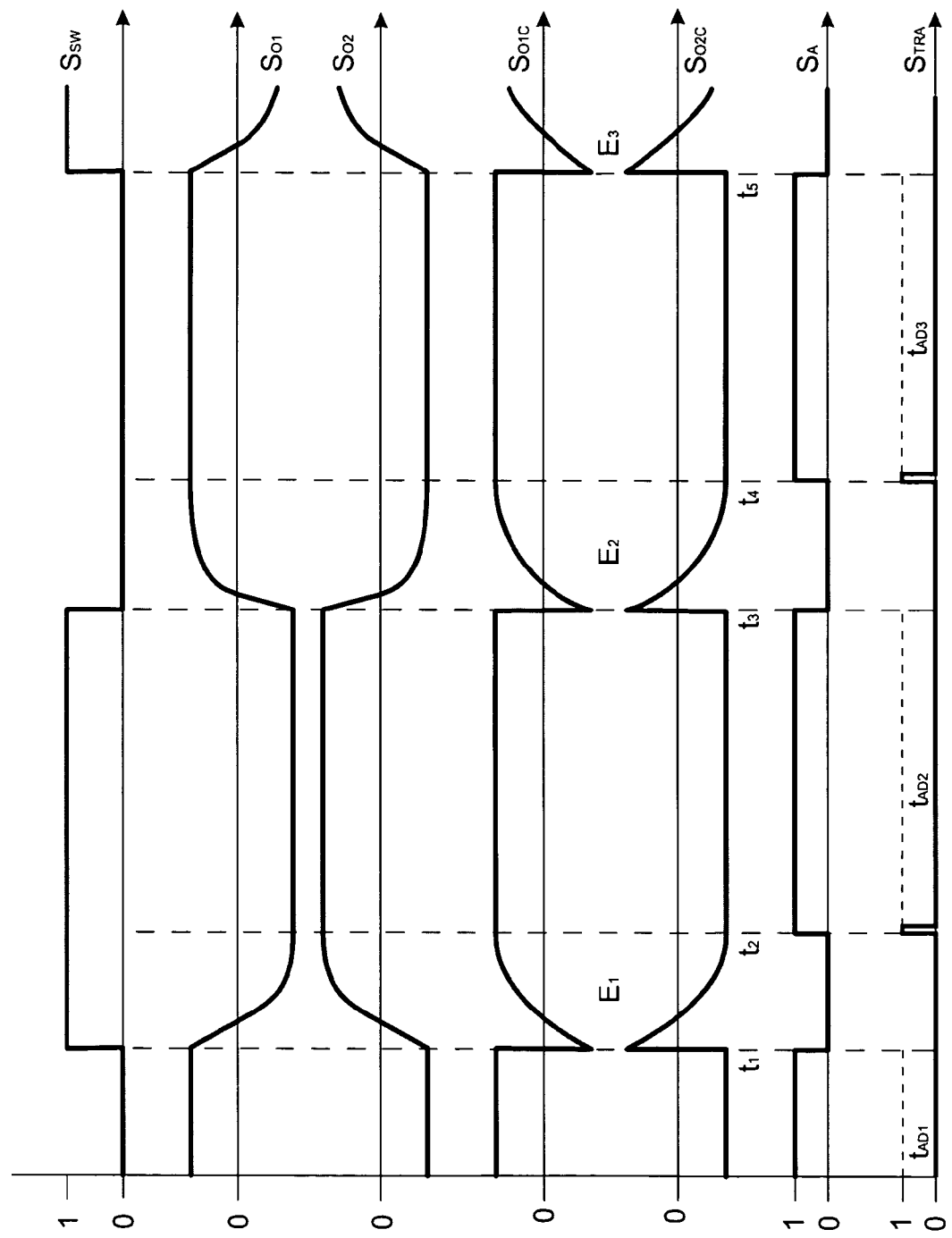
FIG. 8 illustrates exemplary signal profiles pertaining to FIG. 7.

The exemplary measuring device 350 illustrated in FIG. 7 has substantially the same components as the embodiment of FIG. 5. Their arrangement in the circuit is likewise analogous to FIG. 5 and has been described above. As FIG. 7 shows, the timeout- and trigger signals $S_{TRA}$ can also be produced in a combined unit TRAS which includes the trigger signal generator and the timeout controller. With this arrangement, the trigger signal switch TSW of FIG. 5 is eliminated. This kind of a combined controller can be realized by means of hardware and/or software. For example, the timeout signal $S_A$ can act directly on the generation of the trigger signals $S_{TR}$, i.e., cause their suppression. With the combined trigger signal $S_{TRA}$, the A/D conversion of the A/D converters $AD_1$, $AD_2$ is enabled during the time phases $t_2$ to $t_3$, $t_4$ to $t_5$, $\ldots$ and blocked during the timeout phases $t_1$ to $t_2$, $t_3$ to $t_4$, $t_5$ to $t \ldots$. As shown in FIG. 8, only a single combined trigger signal $S_{TRA}$ is generated for the A/D converters during each modulator phase. However, the start of the conversion can be controlled by the timeout controller in such a way that the signals at the input terminals of the A/D converters are free of errors. An even further integration of the controller components is likewise possible if the switchover controller US is integrated in the combined controller TRAS.

The signal profiles $S_{SW}$, $S_{O1}$, $S_{O2}$, $S_{O1C}$, $S_{O2C}$ and $S_A$ shown in FIG. 8 correspond exactly to the signal profiles that are identified by the same symbols in FIG. 6. The seventh graph shows a possible combined trigger signal $S_{TRA}$ for the A/D converters. The graph makes it evident how the timeout signal $S_A$ triggers the start of the A/D converts after the end of the timeout phases $t_1$ to $t_2$, $t_3$ to $t_4$, $t_5$ to $t \ldots$, i.e., after the portions of the amplifier output signals that are in error. The conversion time periods $t_{AD1}$, $t_{AD2}$, $t_{AD3}$, $\ldots$ are indicated by broken lines. During these time intervals, the signals $S_{O1C}$, $S_{O2C}$ which are to be converted must not be corrupted by the transient oscillations of the amplifiers.

Figure 9:
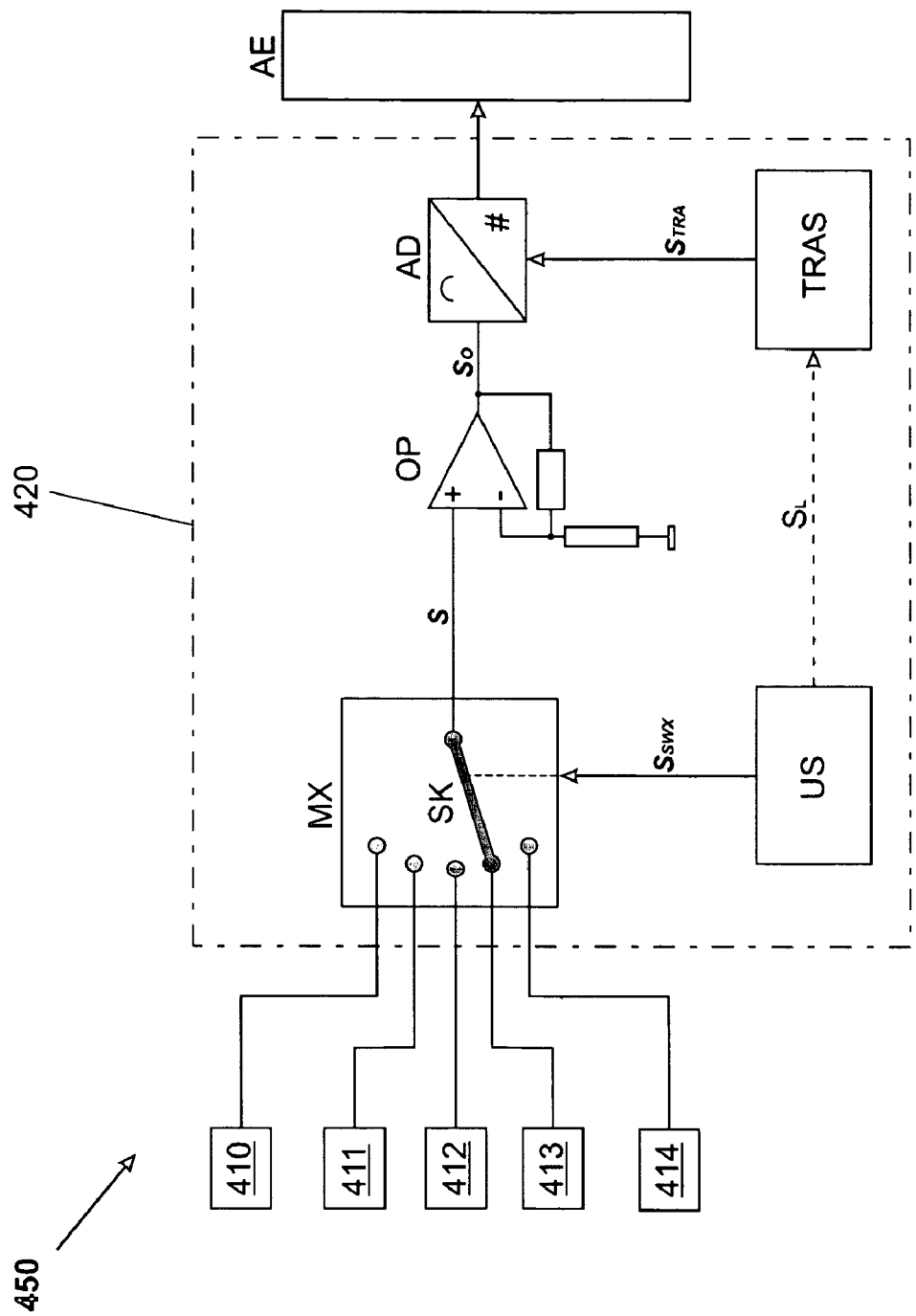
FIG. 9 schematically illustrates another exemplary measuring device with several sensors or force-measuring cells and with a signal-processing unit that is equipped with a multiplexer and a timeout means representing a combination of a trigger signal switch and a timeout controller, wherein the timeout controller causes releasing and blocking of the trigger signals.

FIG. 9 schematically illustrates an exemplary measuring device 450 with a plurality of sensors or force-measuring cells 410, 411, 412, 413, 414 and with a signal-processing unit 420 that is equipped with a multiplexer MX. With this further arrangement which is generally applicable for measuring devices 450 and their signal-processing units 420, transfer errors of an analog amplifier OP which are due to the physically limited capabilities of the latter to follow a switching jump in the amplifier input signal S are likewise prevented by the method according to the invention. Transfer errors of this type in the amplifier output signal $S_O$ can occur for example if the sensor signals of several sensors 410, 411, 412, 413, 414 are delivered sequentially through the multiplexer MX to the amplifier OP. In this case, the output of the amplifier has to settle on a new value after each switching event of the switching contact SK. Analogous to the method described above, the subsequent processing stages can be separated during each of the affected signal portions $E_1$, $E_2$, $E_3$, as is shown in FIGS. 1, 2 and 3. Of course, the further processing can also be suppressed by blocking the subsequent processing stage, in this case an analog/digital converter AD, by means of a combined trigger signal timeout switch TRAS during the timeout phases $t_1$ to $t_2$, $t_3$ to $t_4$, $t_5$ to $t \ldots$, as shown in FIG. 5 or FIG. 6. By way of a signal connection $S_L$, the combined trigger signal timeout switch $T_{RWS}$ is coordinated with the switchover controller US of the multiplexer MX, whereby the timeout phase of the combined trigger signal $S_{TRA}$ is synchronized with the switchover signal $S_{WX}$.

Figure 10:
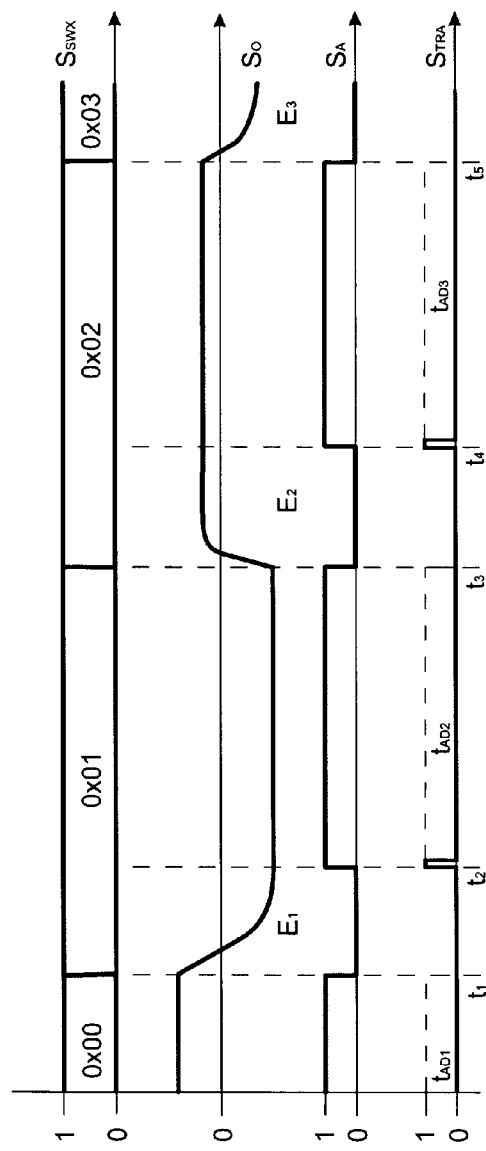
FIG. 10 illustrates exemplary signal profiles pertaining to FIG. 9.

FIG. 10 shows exemplary signal profiles pertaining to FIG. 9, i.e. $S_{WX}$, $S_O$, $S_A$ and $S_{TRA}$. The first graph illustrates a possible time profile of the multiplexer switchover control signal $S_{SWX}$ with the values being indicated in hexadecimal code.

The second graph represents a possible output signal $S_O$ of the amplifier. This graph, likewise, shows clearly how the rise time and bandwidth of the amplifier OP are limited and the effect that this has on the amplifier output signal $S_O$. As the amplifier output signal $S_O$ is composed of the output signals of different measuring cells, the respective amplitudes of the different signal periods likewise differ from each other. The third graph shows a possible timeout signal $S_A$ which the combined trigger signal timeout controller is not sending to the outside, but which serves for the internal processing to generate the combined trigger signal $S_{TRA}$.

The fourth graph shows the combined trigger signal $S_{TRA}$ for the A/D converter. The graph makes it evident how the timeout signal $A_S$ triggers the start of the A/D converter after the ends of the defective signal portions $E_1$, $E_2$, $E_3$ of the affected amplifier output signal $S_O$. The conversion time intervals $t_{AD1}$, $tAD_2$, $t_{AD3}$, $\ldots$ are indicated by broken lines. During these time intervals, the signals that are to be converted must not be corrupted by the transient oscillations of the amplifiers.

FIG. 11 shows different exemplary signal profiles of an amplifier circuit which serve to illustrate the scatter between units and the influence of temperature in amplifiers of the same build. With a jump of the amplifier input signal $S_{OPin}$ at the time $t_1$ and a further jump at the time $t_2$, the theoretical amplifier output signal $S_{OPoutT}$ follows the amplifier input signal $S_{OPin}$ likewise in the manner of a jump and without a time delay. In reality, however, the amplifier shows a totally different behavior due to the physical limitations of its capability. The amplifier has a certain rise time $\tau$ which can be calculated from the slew rate $\alpha$. However, superimposed on this theoretical rise of the response signal is the transient response behavior of the amplifier which is significantly influenced by the feedback resistor and the feedback capacitor, and which conforms approximately to an exponential function. This leads to an amplifier output signal which for example at an operating temperature of 20° C. of the amplifier conforms to the output signal graph $S_{OPout1}$. If this signal is subsequently smoothed by means of a low-pass filter, the resulting signal is shaped in general like the signal graph $S_{OPoutF}$. If measurements are made on a second, identically built amplifier at the same temperature, the second amplifier may have an output signal that deviates from the first amplifier, for example as represented by the output signal graph $S_{OPout2}$ in FIG. 11. Experiments with one and the same component have also led to the conclusion that the transient behavior will change massively with different operating temperatures. Thus, the output signal of the first amplifier at an operating temperature of 60° C. can for example conform to the output signal graph $S_{OPout3}$. Obviously, the filtered amplifier output signals of these three graphs will also have different amplitudes.

It is self-evident that the exemplary methods are not only applicable to a measuring devices with a strain gauge force-measuring transducer, but that it can also be used in measuring devices that operate according to the principle of electromagnetic force compensation. Furthermore, any output signal of sensors such as humidity sensors, temperature sensors, field effect transistor sensors and the like can be amplified with analog amplifiers, and with the exemplary methods the amplifier output signal can be freed of transfer errors of the analog amplifier which are due to the physically limited capability of the latter to follow a jump in the amplifier input signal due to a switching activity.

It will be appreciated by those of ordinary skill in the art that the exemplary methods, modules and devices described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

The invention claimed is:

1. Method for correcting transfer errors of an analog amplifier that occur following a jump in the analog amplifier input signal caused by switching, wherein a signal-processing unit includes at least one modulator and/or a multiplexer, the analog amplifier and at least one processing stage which follows the analog amplifier, comprising at least one of the following steps:
   a) dependent on a point in time when the switching jump occurs, separating the processing stage from the analog amplifier during a predetermined timeout phase duration, and
   b) dependent on a point in time when the switching jump occurs, blocking by means of a control signal the processing stage after the analog amplifier during a predetermined timeout phase duration.

2. Method according to claim 1, wherein the predetermined timeout phase duration corresponds to the rise time or the time constant of the analog amplifier, multiplied by a factor between 2 and 10.

3. Method according to claim 2, wherein the processing stage after the analog amplifier is separated from the analog amplifier by means of a switch, wherein the switch is arranged between the analog amplifier and the processing stage and is actuated by a timeout controller.

4. Method according to claim 2, wherein the signal-processing unit comprises a demodulation switch which follows the analog amplifier, wherein a switchover controller of the modulator acts on the demodulation switch for synchronous demodulation of the output signal of the analog amplifier, and wherein a timeout controller during the predetermined timeout phase duration holds the demodulation switch by means of a timeout signal at a high-impedance switching level or in a high-impedance state.

5. Method according to claim 4, wherein the processing stage that follows the analog amplifier is an analog/digital converter circuit, wherein to generate a timeout phase a timeout controller actuates a trigger signal switch and said trigger signal switch during the timeout phase duration interrupts a trigger signal that is required for the A/D conversion.

6. Method according to claim 4, wherein the processing stage that follows the analog amplifier is an analog/digital converter circuit, and that in order to generate a timeout phase the timeout controller together with a trigger signal generator which generates trigger signals required for the A/D conversion forms a combined trigger-signal-generator/timeout-controller unit, wherein the timeout signals generated by the timeout controller are superimposed on the trigger signals during the timeout phase duration or the generating of the trigger signals is suppressed.

7. Method according to claim 6, wherein the modulator and/or the multiplexer is equipped with a switchover controller and that the timeout signals of the timeout controller can be generated dependent on switchover signals of the switchover controller.

8. Method according to claim 7, wherein an output signal of at least one sensor is delivered to the analog amplifier as an input signal.

9. Method according to claim 8, wherein by means of the modulator the amplifier input signal or the input voltage of the sensor is modulated preferably as an alternating square wave voltage signal.

10. Method according to claim 9, wherein the output signals of at least two sensors are delivered sequentially by means of the multiplexer to the analog amplifier.

11. Amplifier module or integrated amplifier module, operable to perform the method according to claim 10, wherein the amplifier module comprises at least one modulator and/or a multiplexer with at least one switchover controller, at least one analog amplifier following the modulator and/or multiplexer, and at least one processing stage following the at least one analog amplifier, wherein said at least one processing stage includes at least one timeout means which serves to produce a timeout phase with a predetermined timeout-phase duration in the output signal of the at least one analog amplifier.

12. Measuring device, operable to perform the method according to claim 10, with at least one signal-processing unit and with at least one sensor, wherein the at least one signal-processing unit comprises a modulator and/or a multiplexer with a switchover controller, wherein at least one analog amplifier follows the modulator and/or multiplexer, and wherein at least one processing stage follows the at least one analog amplifier, wherein the at least one signal-processing unit comprises at least one timeout means which serves to produce a timeout phase with a predetermined timeout-phase duration in the amplifier output signal of the at least one analog amplifier.

13. Measuring device according to claim 12, wherein the modulator is arranged immediately ahead of the at least one analog amplifier and that the modulator serves for the modulation of the input signal of the at least one analog amplifier.

14. Measuring device according to claim 12, wherein the modulator is arranged ahead of the at least one sensor and that the modulator serves for the modulation of a supply voltage of the at least one sensor and/or of a force-measuring cell and thereby serves for the modulation of the input signal of the at least one analog am amplifier.

15. Measuring device according to claim 14, wherein the at least one timeout means comprises a switch assigned to the signal-processing unit and of a timeout controller connected to said switch, and that the switchover signals of the switchover controller are capable of actuating the timeout controller.

16. Measuring device according to claim 15, wherein the timeout controller comprises a generator and an exclusive element and that by combining the generator signals of the signal generator with the switchover signals, the exclusive element serves to produce timeout signals.

17. Measuring device according to claim 14, wherein the measuring device comprises a demodulation switch arranged so that it follows the at least one analog amplifier in the circuit chain, and wherein the demodulation switch is connected to the switchover controller of the modulator, that the timeout means comprises a timeout controller connected to the demodulation switch and of a high-impedance switching stage that is integrated in the demodulation switch or of a demodulation switch with switching contacts which can be held in a high-impedance state, wherein the switchover signals of the switchover controller are of a suitable nature to actuate the timeout controller of the high-impedance switching stage, and the timeout signals generated by the timeout controller can be superimposed on the switchover signals, or the timeout signals can be combined with the switchover signals.

18. Measuring device according to claim 14, wherein the processing stage which follows the analog amplifier is an analog/digital converter circuit, that the timeout means comprises a trigger signal switch and a timeout controller connected to the trigger signal switch, wherein the trigger signal switch interrupts a trigger signal that is required for the A/D conversion, and further that the switchover signals of the switchover controller are of a suitable nature to actuate the timeout controller.

19. Measuring device according to claim 14, wherein the processing stage which follows the analog amplifier is an analog/digital converter circuit and that the timeout means comprises a combined trigger signal generator and timeout controller which serves to generate trigger signals required for the A/D conversion, wherein the switchover signals of the switchover controller are of a suitable nature to actuate the timeout controller and the timeout controller serves to release or block the trigger signals.

20. Measuring device according to claim 19, wherein the least one sensor is a humidity sensor, a temperature sensor, a pressure sensor, a force-measuring cell with strain gauges, or a force-measuring cell according to the principle of electro-magnetic force compensation.

21. Method according to claim 1, wherein the processing stage after the analog amplifier is separated from the analog amplifier by means of a switch, wherein the switch is arranged between the analog amplifier and the processing stage and is actuated by a timeout controller.

22. Method according to claim 1, wherein the signal-processing unit comprises a demodulation switch which follows the analog amplifier, wherein a switchover controller of the modulator acts on the demodulation switch for synchronous demodulation of the output signal of the analog amplifier, and wherein a timeout controller during the predetermined timeout phase duration holds the demodulation switch by means of a timeout signal at a high-impedance switching level or in a high-impedance state.

23. Method according to claim 1, wherein the processing stage that follows the analog amplifier is an analog/digital converter circuit, wherein to generate a timeout phase a timeout controller actuates a trigger signal switch and said trigger signal switch during the timeout phase duration interrupts a trigger signal that is required for the A/D conversion.

24. Method according to claim 1, wherein the processing stage that follows the analog amplifier is an analog/digital converter circuit, and that in order to generate a timeout phase a timeout controller together with a trigger signal generator which generates trigger signals required for the A/D conversion forms a combined trigger-signal-generator/timeout-controller unit, wherein timeout signals generated by the timeout controller are superimposed on the trigger signals during the timeout phase duration or the generating of the trigger signals is suppressed.

25. Method according to claim 1, wherein the modulator and/or the multiplexer is equipped with a switchover controller and that timeout signals generated by a timeout controller can be generated dependent on switchover signals of the switchover controller.

26. Method according to claim 1, wherein an output signal of at least one sensor is delivered to the analog amplifier as an input signal.

27. Amplifier module or integrated amplifier module, operable to perform the method according to claim 1, wherein the amplifier module comprises at least one modulator and/or a multiplexer with at least one switchover controller, at least one analog amplifier following the modulator and/or multiplexer, and at least one processing stage following the analog amplifier, wherein said processing stage includes at least one timeout means which serves to produce a timeout phase with a predetermined timeout-phase duration in the output signal of the at least one analog amplifier.

28. Measuring device, operable to perform the method according to claim 1, with at least one signal-processing unit and with at least one sensor, wherein the signal-processing unit comprises a modulator and/or a multiplexer with a switchover controller, wherein at least one analog amplifier follows the modulator and/or multiplexer, and wherein at least one processing stage follows the analog amplifier, wherein the at least one signal-processing unit comprises at least one timeout means which serves to produce a timeout phase with a predetermined timeout-phase duration in the output signal of the at least one analog amplifier.

* * * * *